(12) United States Patent
Peng

(10) Patent No.: US 9,417,307 B2
(45) Date of Patent: Aug. 16, 2016

(54) AUTOMATIC THREE-DIMENSIONAL APPROACH METHOD FOR RF COIL ASSESSMENT IN CLINICAL MRI

(71) Applicant: Qi Peng, Bronx, NY (US)

(72) Inventor: Qi Peng, Bronx, NY (US)

(73) Assignee: Montefiore Medical Center, Bronx, NY (US)

( * ) Notice: Subject to any disclaimer, the term of this patent is extended or adjusted under 35 U.S.C. 154(b) by 553 days.

(21) Appl. No.: 14/051,541

(22) Filed: Oct. 11, 2013

(65) Prior Publication Data

US 2014/0176133 A1    Jun. 26, 2014

Related U.S. Application Data

(60) Provisional application No. 61/725,207, filed on Nov. 12, 2012.

(51) Int. Cl.
*G01R 33/58* (2006.01)
*G01R 33/3415* (2006.01)

(52) U.S. Cl.
CPC ............ *G01R 33/58* (2013.01); *G01R 33/3415* (2013.01)

(58) Field of Classification Search
CPC ............................ G01R 33/58; G01R 33/3415
See application file for complete search history.

(56) References Cited

U.S. PATENT DOCUMENTS

2011/0200243 A1* 8/2011 Takizawa ........... G01R 33/4824
                                                382/131
2014/0100441 A1* 4/2014 Jo ..................... G01R 33/56545
                                                600/410

* cited by examiner

*Primary Examiner* — Rodney Bonnette
(74) *Attorney, Agent, or Firm* — Amster, Rothstein & Ebenstein LLP

(57) ABSTRACT

Methods, apparatus and systems are provided for determining the performance of one or more receiver coils of a magnetic resonance imaging (MRI) machine, or a hybrid-MRI machine, employing a substantially uniform 3D phantom and constructing a composite 3D image of the phantom from signals received by a plurality of receiver coils of the MRI or hybrid-MRI machine.

20 Claims, 4 Drawing Sheets

AUTOMATIC THREE-DIMENSIONAL APPROACH METHOD FOR RF COIL ASSESSMENT IN CLINICAL MRI

CROSS-REFERENCE TO RELATED APPLICATIONS

This application claims benefit of U.S. Provisional Application No. 61/725,207, filed Nov. 12, 2012, the contents of which are hereby incorporated by reference.

BACKGROUND OF THE INVENTION

Throughout this application various publications are referred to by number in square brackets. Full citations for the references may be found at the end of the specification. The disclosures of each of these publications, and also the disclosures of all patents, patent application publications and books recited herein, are hereby incorporated by reference in their entirety into the subject application to more fully describe the art to which the subject invention pertains.

MRI RF coil performance evaluation is an important aspect of clinical MRI quality assurance. RF coil performance is usually evaluated with region-of-interest (ROI) analysis from a single or multiple 2D phantom composite images [1, 2]. This simple approach has worked quite well for large volume coils (e.g., quadrature body or head coil) or phased-array coil with large receivers [3]. With the rapid development of coil technology and the wide application of parallel imaging, the number of coil receivers is increasing rapidly and the size of each receiver becomes small [4-6]. This has led to high density phased-array coils, characterized by 3D array arrangement of their multiple receivers. Coils with more than 96 and 128 channels have been proposed for clinical and research MRI [5, 7, 8]. These coils are highly costly but have much higher signal-to-noise ratio (SNR) compared to similar volume coils, especially in areas close to the coil. If one channel fails to work, the small region near the bad channel may have much reduced SNR but the overall composite images may look just normal. This reduced SNR may have an important impact in clinical and research MRI studies. For instance, functional activation in a cortical region in a BOLD (blood oxygenation level dependent) study may not be detected if the coil SNR at that region is compromised. In addition, excessive parallel imaging aliasing artifacts simulating pathological conditions may be generated when one or some of the channels fail to work [4, 6, 9]. It is therefore imperative to look into the function of each individual receiver to make sure the overall performance of the coil is at its optimum.

It is now required that a thorough annual performance survey has to be included for the ACR MRI Accreditation Program. This annual performance survey includes B0 homogeneity test and standard tests on the ACR phantom, and a complete check of all the clinical coils. However, the specific approach to checking the function of the coils is not outlined by the guideline, and is left to the MRI expert who is conducting the survey. Most physicists only look at a single composite image and/or obtain SNR from a single area of the coil. This may result in problems from defected channels being missed. In a recent presentation, it was found that 25% of all phased-array RF coils have at least one bad channel [10]. It is recommended that each channel of every phased-array RF be tested. This process, however, is very time consuming and may take 4-8 hours to complete depending on the number of coils and number of receivers of the coils.

The present invention address the need for improved performance assessment methods.

SUMMARY OF THE INVENTION

This invention provides a method of determining the performance of one or more receiver coils of a magnetic resonance imaging (MRI) machine, or a hybrid-MRI machine, comprising a plurality of radiofrequency receiver coils, the method comprising:

scanning a 3D phantom, which phantom is substantially uniform, in the MRI machine or in the hybrid-MRI machine;

obtaining an individual 3D image of the phantom for each individual receiver coil of the plurality of receiver coils, and also constructing a composite 3D image of the phantom from the composite of the signals received by the plurality of receiver coils, so as to produce n+1 3D images, where n=the number of coils in the plurality of receiver coils;

determining a measurement volume from the composite 3D image;

obtaining a 3D region of interest measurement volume ($ROI_{mv}$) from the measurement volume of the composite 3D image;

determining, for each of the n+1 3D images, (i) the maximum mean signal intensity within the 3D image measurement volume ($ROI_{max}$), and (ii) the minimum mean signal intensity within the 3D image measurement volume ($ROI_{min}$), and determining (iii) a location of a signal void region from where standard deviation can be measured ($ROI_{noise}$) from the composite 3D image;

determining, for each of the n+1 3D images, the signal to noise ratio of the measurement volume ($SNR_{mv}$) and/or the maximum signal to noise ratio ($SNR_{max}$) signal to noise ratio for each 3D image and/or the percent image uniformity (PIU) of each 3D image and determining the $ROI_{noise}$;

comparing the $SNR_{mv}$ and/or $SNR_{max}$ and/or the PIU of each 3D image to a reference $SNR_{mv}$ value, reference $SNR_{max}$ value, and reference PIU value, respectively, so as to determine the performance of the one or more receiver coils, wherein a $SNR_{mv}$ and/or $SNR_{max}$ and/or the PIU less than the reference value of $SNR_{mv}$, $SNR_{max}$ and/or PIU, respectively, is considered unacceptable performance.

The invention also provides a computer system comprising a program for determining the performance of one or more receiver coils of an MRI machine or of a hybrid-MRI machine, the computer system comprising a processor and a memory encoding one or more programs coupled to the processor, wherein the processor effects the one or more programs to effect the instant method.

The invention also provides an apparatus comprising the instant computer system, and instructions for use.

The invention also provides a non-transitory computer readable medium comprising instructions encoded thereon for performing any of the methods described herein.

Additional objects of the invention will be apparent from the description which follows.

DETAILED DESCRIPTION OF THE INVENTION

Figure 1:
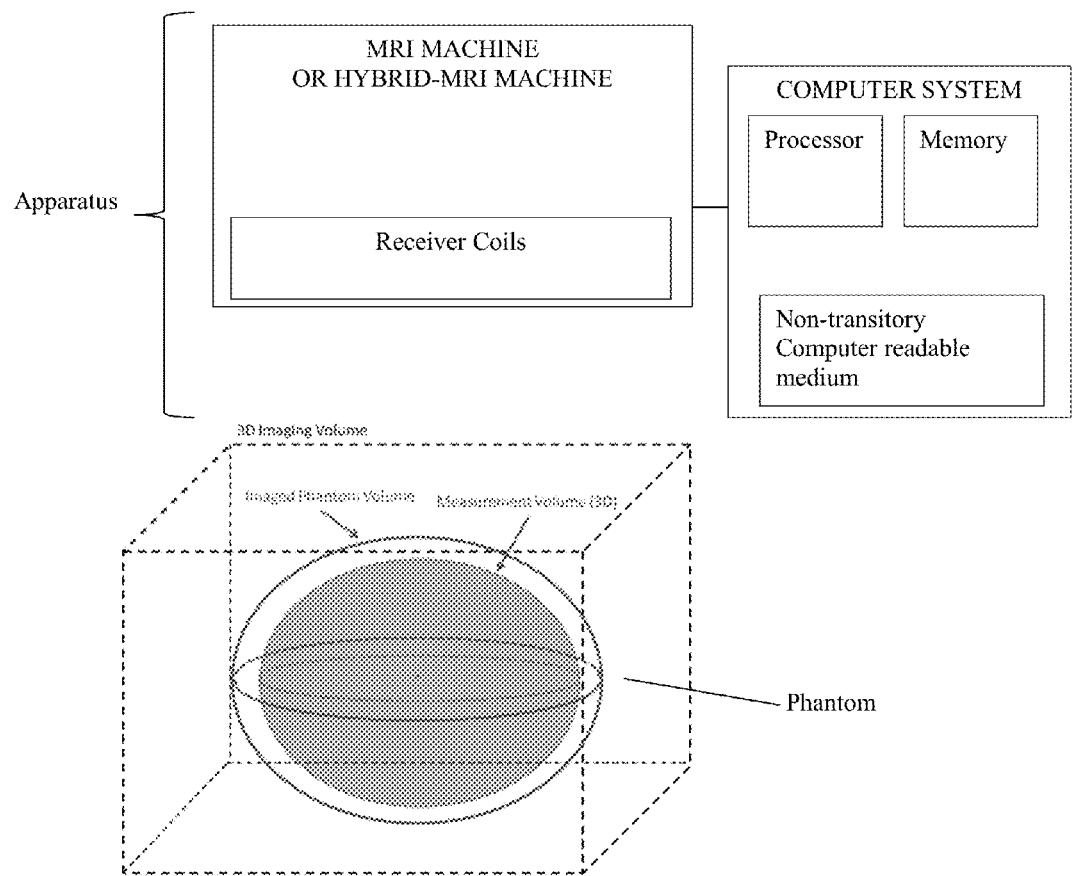
FIG. 1. Schematic plot of the 3D imaging volume, the 3D imaged phantom volume, and the 3D measurement volume. The imaged phantom volume is the 3D phantom region within the imaging volume. The measurement volume is derived from the imaged phantom volume after signal thresholding and/or an erosion operation on the composite 3D image to eliminate voxels not of interest for measurement.

A method is provided of determining the performance of one or more receiver coils of a magnetic resonance imaging (MRI) machine, or a hybrid-MRI machine, comprising a plurality of radiofrequency receiver coils, the method comprising:

scanning a 3D phantom, which phantom is substantially uniform, in the MRI machine or in the hybrid-MRI machine;

obtaining an individual 3D image of the phantom for each individual receiver coil of the plurality of receiver coils, and also constructing a composite 3D image of the phantom from the composite of the signals received by the plurality of receiver coils, so as to produce n+1 3D images, where n=the number of coils in the plurality of receiver coils;

determining a measurement volume from the composite 3D image;

obtaining a 3D region of interest measurement volume ($ROI_{mv}$) from the measurement volume of the composite 3D image;

determining, for each of the n+1 3D images, (i) the maximum mean signal intensity within the 3D image measurement volume ($ROI_{max}$), and (ii) the minimum mean signal intensity within the 3D image measurement volume ($ROI_{min}$), and determining (iii) a location of a signal void region from where standard deviation can be measured ($ROI_{noise}$) from the composite 3D image;

determining, for each of the n+1 3D images, the signal to noise ratio of the measurement volume ($SNR_{mv}$) and/or the maximum signal to noise ratio ($SNR_{max}$) signal to noise ratio for each 3D image and/or the percent image uniformity (PIU) of each 3D image and determining the $ROI_{noise}$;

comparing the $SNR_{mv}$ and/or $SNR_{max}$ and/or the PIU of each 3D image to a reference $SNR_{mv}$ value, reference $SNR_{max}$ value, and reference PIU value, respectively, so as to determine the performance of the one or more receiver coils, wherein a $SNR_{mv}$ and/or $SNR_{max}$ and/or the PIU less than the reference value of $SNR_{mv}$, $SNR_{max}$ and/or PIU, respectively, is considered unacceptable performance.

As used herein a 3D phantom is a body, usually of uniform density, used in the art to represent a scannable object (for example a subject or portion thereof) generally for the purposes of calibrating the MRI or assessing it performance. MRI 3D phantoms are known in the art. In an embodiment, the 3D phantom is phantom. In non-limiting examples, the 3D phantom is phantom is a sphere, (e.g. 31 or 32 cm diameter) filled with water and NiCl, or a 32 cm sphere filled with oil (as available from GE Healthcare, Rahway, N.J., or from Dielectric Corp. Menomonee Falls, Wis.).

In an embodiment, the method further comprises adjusting the one or more receiver coils showing an unacceptable performance deviation from a predetermined reference $SNR_{mv}$ value, a predetermined reference $SNR_{max}$ value, and/or a predetermined reference PIU value so as to obtain a corrected $SNR_{mv}$ value, $SNR_{max}$ value, and/or PIU value, and thereby correct the performance of the MRI.

In an embodiment, the method further comprises replacing the one or more receiver coils showing a deviation from reference $SNR_{mv}$ value, $SNR_{max}$ signal to noise ratio value, and PIU value with one or more replacement receiver coils so as to obtain a corrected $SNR_{mv}$ value, $SNR_{max}$ signal to noise ratio value, and/or PIU value, and thereby correct the performance of the MRI.

In an embodiment, the noise signal for determining signal to noise ratios is determined from an area with void signal. In an embodiment, the method comprises performing a 3D gradient echo sequence to determine the noise.

In an embodiment, the noise signal for determining signal to noise ratios is determined as the standard deviation of the residual located inside the phantom after subtracting two 3D images resulting from two scans.

In an embodiment, the method comprises performing two 3D gradient echo sequences to determine the noise.

In an embodiment, the noise signal for determining the signal to noise ratio is determined by repeating the scan in the absence of resonance frequency excitation.

In an embodiment, the plurality of receiver coils comprises phased-array receiver coils.

In an embodiment, the plurality of receiver coils comprises transmission/receiver coils.

In an embodiment, a 3D gradient echo sequence is used to scan the 3D phantom.

In an embodiment, the performance of the MRI is deemed acceptable if reference $SNR_{mv}$ value, reference $SNR_{max}$ value, and/or reference PIU uniformity value is within ±25% of the median or mean $SNR_{mv}$ value, median or mean $SNR_{max}$ value, and/or median or mean PIU uniformity value, respectively, determined from the n+1 3D images.

In an embodiment, the phantom is a uniform sphere.

In an embodiment, the phantom is a uniform sphere of from 20-35 cm in diameter.

In an embodiment, the phantom is a phantom torso.

In an embodiment, the $SNR_{mv}$ is calculated as the product of $0.655 \times S_{mv}/\sigma$ (sigma), where $S_{mv}$ is the mean signal intensity of the 3D $ROI_{mv}$ and $\sigma$ is the signal intensity standard deviation within the 3D $ROI_{noise}$.

In an embodiment, the $SNR_{max}$ is calculated as $S_{max}/\sigma$ (sigma), where $S_{max}$ is the mean signal intensity of the 3D $ROI_{max}$ and $\sigma$ is the signal intensity standard deviation within the 3D $ROI_{noise}$.

In an embodiment, the PIU is calculated as the product of $100 \times [1-(S_{max}-S_{min})/(S_{max}+S_{min})]$, where $S_{max}$ is the mean signal intensity of the 3D $ROI_{max}$, and $S_{min}$ is the mean signal intensity of the 3D $ROI_{min}$.

In an embodiment, the size of phantom is at least 75% the size of the 3D sensitivity region of the MRI or hybrid MRI.

In an embodiment, the 3D measurement volume is determined using a signal intensity thresholding procedure on the composite image to exclude phantom regions outside of the coil sensitivity region of interest.

In an embodiment, the method comprises performing a 3D erosion operation to exclude boundary voxels of the phantom image.

In an embodiment, the plurality of receiver coils comprises volume coils. In an embodiment, the plurality of receiver coils comprises a head coil.

In an embodiment, the method further comprises subsequently repeating the method one or more times, such that the $SNR_{mv}$ and PIU values from the composite image obtained each time can be compared longitudinally to monitor the performance trend of the MRI over time.

Reference values of $SNR_{mv}$ and/or $SNR_{max}$ and/or the PIU are readily determined by those in the art, and can be, for example, calculated based on machine characteristics, or average values, or from prior machine performance values, amongst other methods.

In an embodiment, deviation by more than ±5% from the reference value of $SNR_{mv}$, $SNR_{max}$ and/or PIU uniformity of the determined $SNR_{mv}$, $SNR_{max}$ and/or PIU uniformity value, respectively, of one or more coils is considered unacceptable performance.

In an embodiment, deviation by more than ±10% from the reference value of $SNR_{mv}$, $SNR_{max}$ and/or PIU uniformity of the determined $SNR_{mv}$, $SNR_{max}$ and/or PIU uniformity value, respectively, of one or more coils is considered unacceptable performance.

In an embodiment, deviation by more than ±15% from the reference value of $SNR_{mv}$, $SNR_{max}$ and/or PIU uniformity of the determined $SNR_{mv}$, $SNR_{max}$ and/or PIU uniformity value, respectively, of one or more coils is considered unacceptable performance.

In an embodiment, deviation by more than ±25% from the reference value of $SNR_{mv}$, $SNR_{max}$ and/or PIU uniformity of the determined $SNR_{mv}$, $SNR_{max}$ and/or PIU uniformity value, respectively, of one or more coils is considered unacceptable performance.

In an embodiment, the method further comprises subsequently repeating the method one or more times, such that the $SNR_{mv}$ and PIU values for each receiver coil image obtained each time can be compared longitudinally to monitor the performance trend of each receiver coil over time.

A computer system is provided comprising a program for determining the performance of one or more receiver coils of an MRI machine or of a hybrid-MRI machine, the computer system comprising a processor and a memory encoding one or more programs coupled to the processor, wherein the processor effects the one or more programs to perform a method of determining the performance of one or more receiver coils of a magnetic resonance imaging (MRI) machine or a hybrid-MRI machine comprising a plurality of radiofrequency receiver coils, the method comprising:

scanning a 3D phantom, which phantom is substantially uniform, in the MRI machine or in the hybrid-MRI machine;

obtaining an individual 3D image of the phantom for each individual receiver coil of the plurality of receiver coils, and also constructing a composite 3D image of the phantom from the composite of the signals received by the plurality of receiver coils, so as to produce n+1 3D images, where n=the number of coils in the plurality of receiver coils;

determining a measurement volume from the composite 3D image;

obtaining a 3D region of interest measurement volume ($ROI_{mv}$) from the measurement volume of the composite 3D image;

determining, for each of the n+1 3D images, (i) the maximum mean signal intensity within the 3D image measurement volume ($ROI_{max}$), and (ii) the minimum mean signal intensity within the 3D image measurement volume ($ROI_{min}$), and determining (iii) a location of a signal void region from where standard deviation can be measured ($ROI_{noise}$) from the composite 3D image;

determining, for each of the n+1 3D images, the signal to noise ratio of the measurement volume ($SNR_{mv}$) and/or the maximum signal to noise ratio ($SNR_{max}$) signal to noise ratio for each 3D image and/or the percent image uniformity (PIU) of each 3D image and determining the $ROI_{noise}$; and comparing the $SNR_{mv}$ and/or $SNR_{max}$ and/or the PIU of each 3D image to a reference $SNR_{mv}$ value, reference $SNR_{max}$ value, and reference PIU value, respectively, so as to determine the performance of the one or more receiver coils, wherein a $SNR_{mv}$ and/or $SNR_{max}$ and/or the PIU less than the reference value of $SNR_{mv}$, $SNR_{max}$ and/or PIU, respectively, is considered unacceptable performance.

In an embodiment, the computer system comprises a visual display. In an embodiment, the visual display displays the determined $SNR_{max}$ of each receiver coil in a color-coded manner.

An apparatus is provided comprising the instant computer system and instructions for use. In an embodiment, the apparatus further comprises an MRI device or a hybrid-MRI device.

Embodiments of the invention and all of the functional operations described in this specification can be implemented in digital electronic circuitry, or in computer software, firmware, or hardware. Embodiments of the invention can be implemented as one or more computer program products, i.e., one or more modules of computer program instructions encoded on a computer readable medium for execution by, or to control the operation of, data processing apparatus, preferably as a component of an MRI system. The computer readable medium can be a machine readable storage device, a machine readable storage substrate, a memory device, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device. Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the invention can be implemented on a computer having a display device, e.g., in non-limiting examples, a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The components of the system can be interconnected by any form or medium of digital data communication, e.g., a communication network. Examples of communication networks include a local area network ("LAN") and a wide area network ("WAN"), e.g., the Internet.

Methods for measuring image SNR are known. The National Association of Electronic Manufacturer's (NEMA) MS 1 protocol describes four methods to measure image SNR (e.g. see /www.nema.org/stds/ms1.cfm), which is hereby incorporated by reference therefor.

The computing system can include clients and servers. A client and server are generally remote from each other and typically interact through a communication network. The relationship of client and server arises by virtue of computer programs running on the respective computers and having a client-server relationship to each other.

The invention also provides a non-transitory computer readable medium comprising instructions encoded thereon for performing any of the methods described herein.

In an embodiment, the non-transitory computer readable medium is contained within a computer device controlling an MRI machine or hybrid MRI machine.

All combinations of the various elements described herein are within the scope of the invention unless otherwise indicated herein or otherwise clearly contradicted by context.

This invention will be better understood from the Experimental Details, which follow. However, one skilled in the art will readily appreciate that the specific methods and results discussed are merely illustrative of the invention as described more fully in the claims that follow thereafter.

Experimental Details

Here a novel approach for fully automated, quantitative coil evaluation is disclosed, based on 3D imaging and 3D ROI analysis. To show this approach can be applied generally to all coils, both a traditional 4 channel phased-array torso coil and a high density 32 channel head coil on GE and Philips MR platforms were evaluated with this approach.

Although there are many metrics being used for coil assessment, the focus of clinical coil performance evaluation is the measurement of SNR, specifically, the composite SNR when all coil elements are used, and SNR of each individual coil element. In addition, signal uniformity over the imaging volume of interest is also an important metric to evaluate for a volume phased-array coil. There are multiple ways to measure SNR from MR images. The easiest and most commonly used method is the simple method, which is used by ACR MRI accreditation. In this method, SNR is calculated by the ratio of two values, the mean signal value and the standard deviation (S.D.) of the noise. This method assumes the noise distribution in the image is invariant, which is not true in many MRI images. In most MR platforms, some post-processing steps such as geometric distortion correction, noise filtering, and adaptive channel combination have been applied before the final composite MR images are generated. These procedures changed the noise distribution. Other SNR measurement methods can be used. A popular method is recommend by NEMA, which generate a "noise" dataset by subtracting two repeated scans. This method doubles the imaging duration, but generally results in more consistent SNR measurement. The simple SNR measurement method is used here to demonstrate the methodology. The NEMA method or other known methods can also be employed.

To characterize all receivers of the coil of interest, a large uniform phantom (preferably a large anthropomorphic phantom corresponding to the coil being studied) and a large 3D geometric coverage fully includes the coil sensitivity volume of interest should be applied in MR imaging. To reduce scan duration for the 3D acquisition, a short-TR gradient-recalled echo (GRE) sequence can be used to obtain a receiver SNR distribution map. MR platform-specific image processing steps which may alter noise distribution need to be turned off if possible. Only one scan is needed if simple SNR measurement method is used. After imaging, data from all receivers will be used to reconstruct a composite 3D image, and to reconstruct 3D images from each individual receiver, leading to a total of N+1 3D image datasets (where N is the number of coil channels). In some MR platforms, the composite image is constructed through adaptive combination of data from all receivers, which leads to significantly changed spatial SNR distribution. In that situation, a composite image constructed from a linear combination of the receiver data can be used for better SNR measurement. Instead of choosing one or more 2D slices out of each 3D dataset for SNR and uniformity measurements, each whole 3D dataset was treated as a 3D image, and 3D ROIs are used to obtain the needed measurements. A few postprocessing steps can be taken to measure SNR and uniformity of the composite and individual channel datasets. The following is a non-limiting example of a suitable method:

Step 1: Generating 3D Measurement Volume: The first step is to determine the 3D measurement volume ($ROI_{mv}$) from the 3D composite image, which is the region from where the signal of the whole volume of interest is measured. Ideally, the phantom size is large or comparable to the 3D sensitivity region of interest of the coil. If a phantom does not encompass the whole sensitivity region of interest of the coil, SNR and uniformity measurements will be compromised since contributions from some channels are not fully included in the imaging dataset. The 3D measurement volume can be generated using a signal intensity thresholding procedure on the composite image to exclude phantom regions outside of the coil sensitivity region of interest. These regions usually have relatively low signal intensity on the composite image. In some situations, a 3D erosion operation can be performed to exclude boundary voxels of the phantom image into consideration, particularly for volume coils such as a head coil when SNR and uniformity performance of the center of the coil is more important. For instance, the ACR's quality control manual recommends using a circle that contains 80% of the phantom for volume coils as the area to be considered for measurement on a 2D phantom image [ref]. The general relationship of the 3D imaging volume, the 3D imaged phantom volume, and the 3D measurement volume are shown in FIG. 1.

Figure 2:
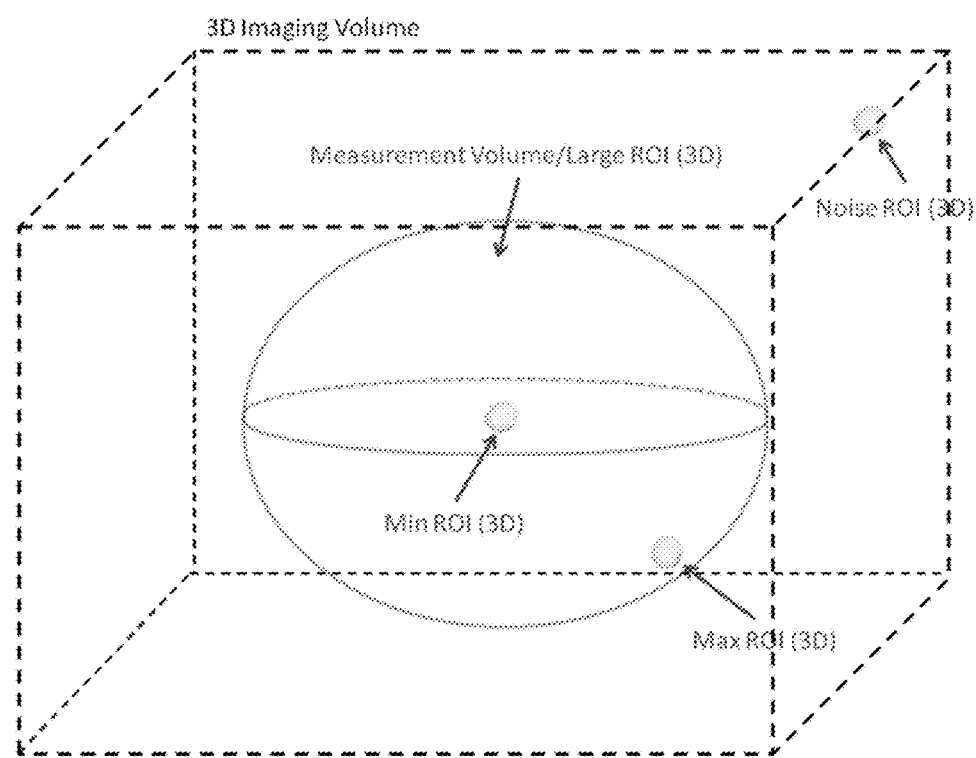
FIG. 2. Schematic plot of the 3D ROIs for SNR and uniformity evaluation for each dataset. The large ROI is the 3D measurement volume itself. The max ROI is the 3D ROI within the large ROI which has the highest mean signal intensity, and the min ROI is the one with lowest mean signal intensity. The 3D noise ROI is located in signal void region where standard deviation can be measured to calculate SNR when simple SNR method is used.

Step 2: Generating 3D ROIs: The second step during post-processing is to generate the 3D ROIs from where the signals and noise standard deviation are measured. In addition to the 3D $ROI_{mv}$ that has been generated in the first step, the following 3D ROIs will be automatically generated for each of the N+1 3D images (i.e., the composite 3D image and the N single-receiver 3D images): 1) $ROI_{max}$, which has the maximum mean signal intensity within the measurement volume; 2) $ROI_{min}$, which has the minimum mean signal intensity within the measurement volume; 3) $ROI_{noise}$, which is the located at the signal void region from where standard deviation ($\sigma$) can be measured. The shape and size of these 3D ROIs can be user determined for different coils but factors such as coil element size and imaging matrix size need to be taken into consideration. A schematic plot of the relationship of these ROIs is shown in FIG. 2.

Step 3: SNR and Uniformity Measurement: Once all ROIs for each of the N+1 3D images (i.e., the composite image and all the individual channel 3D images) are generated, SNR and uniformity quantified by Percent Image Uniformity (PIU) of each image can be calculated as follows:

$$SNR_{mv} = 0.655 \times S_{mv}/\sigma \qquad (1)$$

$$SNR_{max} = S_{max}/\sigma \qquad (2)$$

$$PIU = 100 \times [1 - (S_{max} - S_{min})/(S_{max} + S_{min})] \qquad (3)$$

where, $S_{mv}$ is the mean signal intensity of the 3D $ROI_{mv}$.
$S_{max}$ is the mean signal intensity of the 3D $ROI_{max}$.
$S_{min}$ is the mean signal intensity of the 3D $ROI_{min}$.
$\sigma$ is the signal intensity standard deviation within the 3D $ROI_{noise}$.

Note that $ROI_{mv}$ and $ROI_{noise}$ may have the same spatial location in the single-receiver images as in the composite image. However, the positions of the $ROI_{max}$ and 3D $ROI_{min}$ have to be recalculated and updated based on the individual receiver dataset, using the same algorithm as in the 3D composite imaging. Therefore, $SNR_{mv}$, $SNR_{max}$, and U of each receiver dataset can be derived from values measured from these ROIs, similar as in the composite 3D image situation. Once $SNR_{mv}$, $SNR_{max}$, and U results for the composite and single-element images are calculated, they can be tabulated for easy view and comparison, as shown in Tables 1, 2, and 3.

Figures 3A, 3B, 3C, 3D, 3E, 3F:
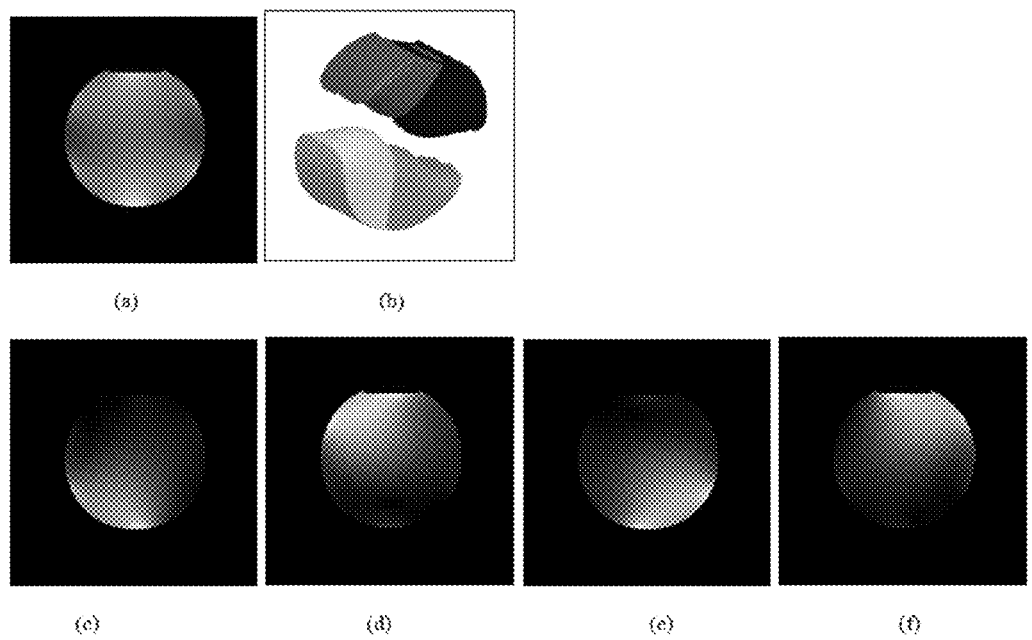
FIG. 3. Representative images of a traditional 4-ch body torso coil. (a) 2D composite image; (b) 3D receiver sensitivity map; (c-f): Single receiver images reconstructed from receiver #1-4 only (Slice #30)
Figures 4A, 4B, 4C, 4D, 4E:
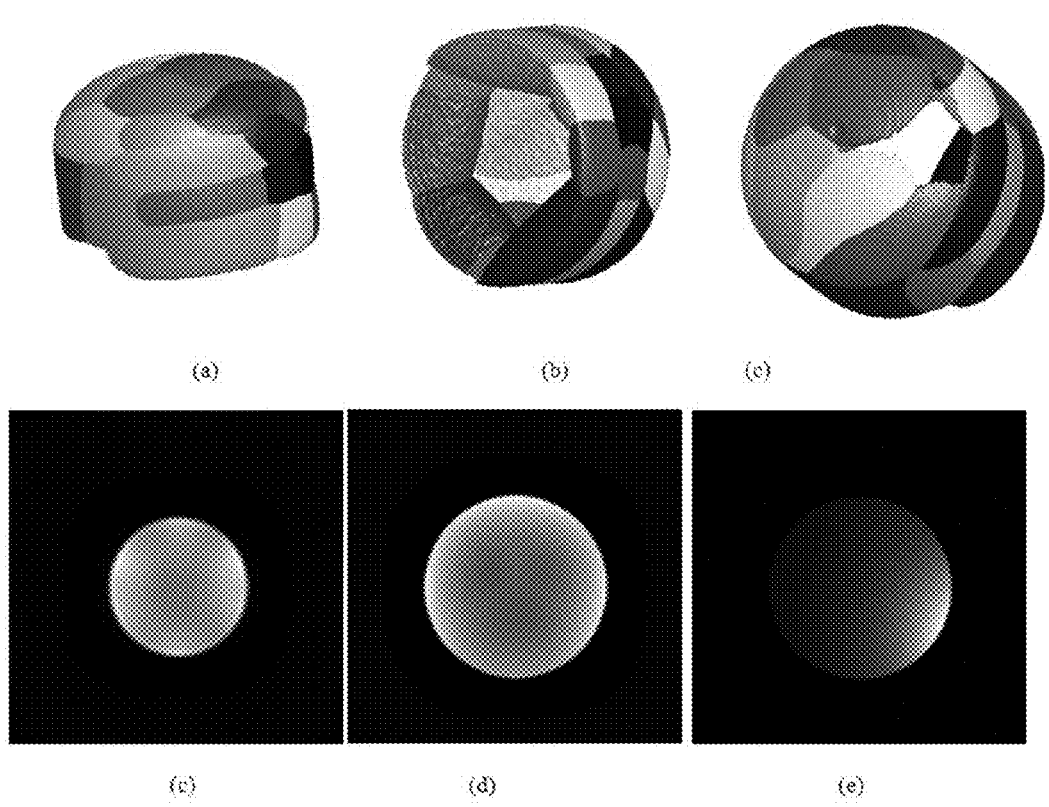
FIG. 4. Representative results from a 32 channel head coil. (a) external view of the 3D receiver sensitivity map; (b) Another view of the 3D receiver sensitivity map; (c) composite image reconstructed from all 32 receivers (slice #107); (d) composite image (slice #70); (e) Single receiver image reconstructed from receiver #28 only (Slice #70).

Step 4: Coil Evaluation: As the results generated with this method are quite thorough and detailed, they can be compared and evaluated in a few different ways. Most commonly, $SNR_{mv}$, $SNR_{max}$, and PIU results from single-receiver images can be used to assess performance of different coil elements, and $SNR_{mv}$, $SNR_{max}$, and PIU from the composite image can be used to overall coil performance in different longitudinal studies and by different coils. When a phased-array coil has to be evaluated based on a single study without an established baseline obtained from longitudinal/repeated studies, results from individual-receiver images are used to single-out defective coil elements as they generally have much lower $SNR_{max}$ and $SNR_{mv}$ compared to others. It is worth noting that the vender SNR and uniformity specifications of the coil cannot be applied to the results of studies using this method, since those are settled under a different specific experimental setup and evaluation method. However, the SNR consistency among all the receivers can be checked, since defective coil elements contributed to the majority of the RF coil failures. Coil elements with similar geometry and size should have comparable SNR and uniformity. In addition, inherently symmetric coil elements should also have comparable SNR and uniformity. It is visually intuitive to combine color-coded coil SNR contribution into a 3D composite SNR "distribution" map, as shown in FIGS. 3b, 4a-c. This 3D composite receiver sensitivity object can be constructed by combining all the thresholded $SNR_{max}$ map of each individual receiver dataset. The 3D sensitivity map will give a direct and intuitive presentation of the performance of each element when compared to other elements in the same coil. In FIG. 3b, the color-coded 3D map of a 4-channel phased-array torso coil is shown. In FIG. 4c, a hole on the 3D map is present to demonstrate a local SNR drop, indicating a corresponding failed coil element.

In addition, $SNR_{mv}$ and PIU from the composite image can be compared longitudinally to monitor the overall performance trend over time. A baseline and an action limit can be setup for each evaluation metric. The same can be applied to monitor performance of each individual coil element. When comparing performance of different coils, the phantom, phantom/coil positioning, imaging protocol, and evaluation methods have to be consistent to make the results interpretable. Overall, the 3D imaging and 3D coil evaluation method as proposed here needs less strict requirement on these conditions compared to traditional 2D evaluation approaches, making these comparisons more feasible and meaningful.

Other Considerations: There are a few methods to measure SNR. The major difference is how the noise image is generated. In the simple method, the noise is derived from area with void signal (e.g, air). In NEMA method, subtraction of two datasets acquired with the same sequence is performed to get a noise dataset, where noise ROIs can be drawn and standard deviation can be measured. A noise dataset can also be generated by repeating the scan but with no RF excitation [ref]. To apply the 3D coil evaluation method to generate the composite SNR and individual receiver SNR, the corresponding 3D noise ROIs have to be generated on the 3D noise dataset, which can also be automatically generated using a method similar as described in the prior section.

Although the work presented here focuses on the assessment of phased-array receiver coils, this approach can be applied to transmission coil or T/R coil evaluation.

Discussion

Thorough coil examination is an important but currently time-consuming. A simplified approach without considering coil loading, channel coupling, etc. is preferred. Current NEMA standards and ACR recommendation call for a 2D method based on SE and 2D imaging and post-processing. However, it could be considered that the current methods are not adequate for more advanced high-density phased-array coils. All the NEMA and ACR standards are using 2D approach.

Additionally, for proper coil performance analysis, it is preferable that every channel of every phased-array coil be examined. Relying on the composite images alone will invariably result in missed problems. This is especially true when the number of receiver elements for these phased array coils increases. In addition, presently, standard coil dysfunction criteria are not available.

An embodiment of the present 3D method provides a visual display offering an intuitive view of an SNR distribution map, and quantitative 3D SNR measurement over the whole potential imaging region. A 3D evaluation is closer to the real performance of the coil within the coil sensitivity region of interest.

The 3D coil assessment approach has been proven to be fast and generally applicable to all types of clinical coils. It has a number of advantages compared to the traditional 2D imaging and 2D ROI analysis method which is currently widely used. First, ROIs (signal ROIs and noise ROIs) do not have to be pre-defined but will be automatically specified by the preset algorithm. This will make it a general method for a variety of coils and experimental setup. Second, phantom/coil positioning reproducibility requirements are reduced in repeat studies when 3D approach is used. The results are not subject to the prescription of the 2D slice, but rather only dependent of phantom and coil proximity and array geometry. Furthermore, it eliminates subjective positioning of the ROIs, which may lead to substantially different results. Third, overall time needed to image and assess the coils is reduced dramatically because only one (simple SNR method) or two (NEMA SNR method) fast 3D gradient echo sequence scans are needed, which can be done within 2-4 minutes. It is no longer needed to perform 2D imaging along different orientations to cover all the receivers that need to be checked. The fully automated postprocessing generally takes seconds for all coil element evaluations, as compared to laborious manual ROI drawing in traditional approach. In addition, imaging processing is performed in a single 4D image space (3D image and 1D receiver array) for each coil. This demands higher computational performance but needs relatively simple and general computer algorithm with no or minimized human involvement. Additionally, metrics for coil/receiver performance can be easily defined, obtained, and quantitatively compared over time or between coils. The color-coded, 3D SNR sensitivity map can visually present the SNR performance of each receiver when compared to all of its counterparts. All those advantages make this 3D approach a fast, convenient, and less subjective coil assessment approach well suitable for regular clinical MRI RF coil assessments by MRI service engineers and medical physicists.

Conclusion 3D imaging in combination with 3D automatic ROI analysis is a fast, convenient, and less subjective approach for quantitative coil assessment, particularly for high density phased-array coils. It has the potential to replace the traditional approach with 2D imaging and 2D ROI processing.

It is anticipated that this novel 3D coil evaluation approach will provide a fast and general solution to evaluate clinical and research RF coils under different MR platforms and provide valuable information relating to MRI coil reliability and performance by repeating these tests at regular intervals over an extended period of time.

Method Validation

This 3D coil evaluation approach was applied to all clinical coils including quadrature body/head coils, and phased-array coils with 2 to 32 channels on different MR platforms. Typical scan parameters of the GRE sequence included: TR/TE/FA=6 ms/3 ms/3°, FOV=480×480×550 mm, Matrix Size=192×192×110, slice thickness=5 mm, BW=100 kHz. Imaging for this protocol took about 2 min (?). If NEMA method was used or no RF method was used in SNR calculation, an additional similar scan was performed, either the same protocol parameters, or had the RF turned off. IDL programs are developed to automatically perform ROI analysis on the composite image and on the individual receiver images.

Auto Max/Min/Noise/Large ROI positioning: The large 3D ROIs is obtained from the composite image, leading to relatively uniform signal intensity on the phantom. This large ROI was then copied to all the other single-receiver 3D datasets. The "Max/Min ROIs" were automatically generated by the algorithm, corresponding to the max and min signal intensity areas of each 3D image within the large 3D ROI. The 3D "noise ROI" was positioned at the background and its standard deviation was used as the background noise for SNR calculation.

Experiment 1

Although this 3D coil assessment approach can be applied to high density coils with many receivers, it is also compatible with traditional coils with single or just a few receivers. This example shows the results of a 4 channel phased-array torso coil on a GE 1.5T Signa Excite system. A torso phantom provided by the vender was utilized. The 4-channel body coil was used to wrap the phantom around, as suggested by the vender. Instead of obtaining a single 2D image axially, a 3D GRE sequence was applied. Images were evaluated using the same algorithm as described in the "General Method" section. It was found that channel #4 had significantly smaller SNR compared to other 3 channels (Table 1). This result was confirmed by a GE engineer. The coil was therefore replaced with a new one. The new coil was check using the same 3D approach and resulted expected results, as shown in Table 2.

TABLE 1

Coil Test Result of a 4 channel Torso Coil when Ch#4 failed

| Channel# | Large ROI | Max ROI | Min ROI | BG Noise | Uniformity | Mean SNR | Max SNR |
|---|---|---|---|---|---|---|---|
| All | 216.66 | 237.16 | 139.76 | 1.35 | 0.74 | 160.26 | 175.42 |
| 1 | 74.81 | 120.12 | 20.29 | 1.08 | 0.29 | 69.34 | 111.34 |
| 2 | 85.65 | 133.02 | 27.11 | 0.84 | 0.34 | 101.38 | 157.45 |
| 3 | 79.09 | 112.34 | 14.29 | 0.89 | 0.23 | 88.71 | 126.00 |
| 4 | 11.36 | 21.42 | 3.46 | 1.00 | 0.28 | 11.37 | 21.44 |

TABLE 2

Coil Test Result of a 4 channel Torso Coil

| Channel# | Large ROI | Max ROI | Min ROI | BG Noise | Uniformity | Mean SNR | Max SNR |
|---|---|---|---|---|---|---|---|
| All | 180.57 | 330.77 | 115.40 | 0.44 | 0.52 | 414.57 | 759.40 |
| 1 | 71.58 | 244.38 | 9.28 | 0.58 | 0.07 | 123.00 | 419.97 |
| 2 | 75.58 | 243.15 | 5.96 | 0.46 | 0.05 | 163.48 | 525.90 |
| 3 | 77.37 | 245.85 | 5.03 | 0.46 | 0.04 | 168.35 | 534.93 |
| 4 | 68.65 | 222.25 | 11.42 | 0.52 | 0.10 | 132.53 | 429.03 |

TABLE 3

Coil Test Result of a 32-channel Head Coil
(only 24 of 32 channels are shown here)

| Channel | Large ROI | Max ROI | Min ROI | BG Noise | Uniformity (%) | Mean SNR | Max SNR |
|---|---|---|---|---|---|---|---|
| All | 731.4 | 891.1 | 358.9 | 2.69 | 57.4 | 271.5 | 330.8 |
| 1 | 197.0 | 774.3 | 18.3 | 3.41 | 4.6 | 57.8 | 227.0 |
| 2 | 130.9 | 535.9 | 64.0 | 3.25 | 21.3 | 40.3 | 165.0 |
| 3 | 154.2 | 584.3 | 43.2 | 3.66 | 13.8 | 42.1 | 159.5 |
| 4 | 157.9 | 696.1 | 56.0 | 3.09 | 14.9 | 51.0 | 225.0 |
| 5 | 187.4 | 844.5 | 30.9 | 3.21 | 7.1 | 58.4 | 263.1 |
| 6 | 124.4 | 477.9 | 30.6 | 3.49 | 12.0 | 35.6 | 136.9 |
| 7 | 113.6 | 453.7 | 19.6 | 3.15 | 8.3 | 36.1 | 144.1 |
| 8 | 163.1 | 658.6 | 85.8 | 3.06 | 23.1 | 53.2 | 215.0 |
| 9 | 117.7 | 477.1 | 7.4 | 3.89 | 3.0 | 30.2 | 122.6 |
| 10 | 113.8 | 452.1 | 5.5 | 3.67 | 2.4 | 31.0 | 123.2 |
| 11 | 129.7 | 463.4 | 6.4 | 3.72 | 2.7 | 34.9 | 124.7 |
| 12 | 122.8 | 476.7 | 9.6 | 3.36 | 3.9 | 36.6 | 141.9 |
| 13 | 171.1 | 568.2 | 34.4 | 3.80 | 11.4 | 45.0 | 149.4 |
| 14 | 175.4 | 564.8 | 27.7 | 3.65 | 9.4 | 48.1 | 154.8 |
| 15 | 172.0 | 515.0 | 26.8 | 3.91 | 9.9 | 44.0 | 131.8 |
| 16 | 155.3 | 558.5 | 24.7 | 4.38 | 8.5 | 35.5 | 127.6 |
| 17 | 187.3 | 844.6 | 15.2 | 4.42 | 3.5 | 42.4 | 191.2 |
| 18 | 115.1 | 517.6 | 47.2 | 3.45 | 16.7 | 33.4 | 150.2 |
| 19 | 122.4 | 571.4 | 16.8 | 3.43 | 5.7 | 35.7 | 166.8 |
| 20 | 143.4 | 694.9 | 43.1 | 2.39 | 11.7 | 60.1 | 291.1 |
| 21 | 162.4 | 831.2 | 26.3 | 3.24 | 6.1 | 50.2 | 256.7 |
| 22 | 140.0 | 496.4 | 39.9 | 3.42 | 14.9 | 40.9 | 145.0 |
| 23 | 113.6 | 453.7 | 19.6 | 3.15 | 8.3 | 36.1 | 144.1 |
| 24 | 117.7 | 477.1 | 7.4 | 3.89 | 3.0 | 30.2 | 122.6 |
| 25 | 113.8 | 452.1 | 5.5 | 3.67 | 2.4 | 31.0 | 123.2 |
| 26 | 129.7 | 463.4 | 6.4 | 3.72 | 2.7 | 34.9 | 124.7 |
| 27 | 122.8 | 476.7 | 9.6 | 3.36 | 3.9 | 36.6 | 141.9 |
| 28 | 193.1 | 677.2 | 77.1 | 3.56 | 20.4 | 54.2 | 190.1 |
| 29 | 249.8 | 753.3 | 100.9 | 3.99 | 23.6 | 62.6 | 188.7 |
| 30 | 241.5 | 740.8 | 70.0 | 4.40 | 17.3 | 55.0 | 168.5 |
| 31 | 164.4 | 830.2 | 28.1 | 3.22 | 6.0 | 51.1 | 257.8 |
| 32 | 173.9 | 633.0 | 72.7 | 4.26 | 20.6 | 40.8 | 148.6 |

REFERENCES

1. Association, N.E.M., *Determination of Signal-to-Noise Ratio (SNR) in Diagnostic Magnetic Resonance Imaging*, in NEMA Standards Publication MS1-20082008.
2. Greene T, S. R., and Reeve D, *Automated Analysis of MRI Radio Frequency Coil Performance*. Medical Physics, 2011. 38(6): p. 3423.
3. Roemer, P. B., et al., *The NMR phased array*. Magn Reson Med, 1990. 16(2): p. 192-225.
4. Pruessmann, K. P., et al., *SENSE: sensitivity encoding for fast MRI*. Magn Reson Med, 1999. 42(5): p. 952-62.
5. Hardy, C. J., et al., *128-channel body MRI with a flexible high-density receiver-coil array*. J Magn Reson Imaging, 2008. 28(5): p. 1219-25.
6. Sodickson, D. K. and W. J. Manning, *Simultaneous acquisition of spatial harmonics (SMASH): fast imaging with radiofrequency coil arrays*. Magn Reson Med, 1997. 38(4): p. 591-603.
7. Wiggins, G. C., et al., *96-Channel receive-only head coil for 3 Tesla: design optimization and evaluation*. Magn Reson Med, 2009. 62(3): p. 754-62.
8. Schmitt, M., et al., *A 128-channel receive-only cardiac coil for highly accelerated cardiac MRI at 3 Tesla*. Magn Reson Med, 2008. 59(6): p. 1431-9.
9. Sodickson, D. K., M. A. Griswold, and P. M. Jakob, *SMASH imaging*. Magn Reson Imaging Clin N Am, 1999. 7(2): p. 237-54, vii-viii.
10. NessAiver, M., *Range of Results from over 475 ACR-mandated Annual MRI Performance Evaluations on over 180 Magnets from 7 Vendors Spanning a 10-year Period*, in RSNA 2011.

What is claimed:

1. A method of determining the performance of one or more receiver coils of a magnetic resonance imaging (MRI) machine, or a hybrid-MRI machine, comprising a plurality of radiofrequency receiver coils, the method comprising:
   scanning a 3D phantom, which phantom is uniform, in the MRI machine or in the hybrid-MRI machine;
   obtaining an individual 3D image of the phantom for each individual receiver coil of the plurality of receiver coils, and also constructing a composite 3D image of the phantom from the composite of the signals received by the plurality of receiver coils, so as to produce n+1 3D images, where n=the number of coils in the plurality of receiver coils;
   determining a measurement volume from the composite 3D image;
   obtaining a 3D region of interest measurement volume ($ROI_{mv}$) from the measurement volume of the composite 3D image;
   determining, for each of the n+1 3D images, (i) the maximum mean signal intensity within the 3D image measurement volume ($ROI_{max}$), and (ii) the minimum mean signal intensity within the 3D image measurement volume ($ROI_{min}$), and determining (iii) a location of a signal void region from where standard deviation can be measured ($ROI_{noise}$) from the composite 3D image;
   determining, for each of the n+1 3D images, the signal to noise ratio of the measurement volume ($SNR_{mv}$) and/or the maximum signal to noise ratio ($SNR_{max}$) signal to noise ratio for each 3D image and/or the percent image uniformity (PIU) of each 3D image and determining the $ROI_{noise}$; and
   comparing the $SNR_{mv}$ and/or $SNR_{max}$ and/or the PIU of each 3D image to a reference $SNR_{mv}$ value, reference $SNR_{max}$ value, and reference PIU value, respectively, so as to determine the performance of the one or more receiver coils,
   wherein a $SNR_{mv}$ and/or $SNR_{max}$ and/or the PIU less than the reference value of $SNR_{mv}$, $SNR_{max}$ and/or PIU, respectively, is considered unacceptable performance.

2. The method of claim 1, further comprising adjusting the one or more receiver coils showing an unacceptable performance deviation from a predetermined reference $SNR_{mv}$ value, a predetermined reference $SNR_{max}$ value, and/or a predetermined reference PIU value so as to obtain a corrected $SNR_{mv}$ value, $SNR_{max}$ value, and/or PIU value, and thereby correct the performance of the MRI.

3. The method of claim 1, further comprising replacing the one or more receiver coils showing a deviation from reference $SNR_{mv}$ value, $SNR_{max}$ signal to noise ratio value, and PIU value with one or more replacement receiver coils so as to obtain a corrected $SNR_{mv}$ value, $SNR_{max}$ signal to noise ratio value, and/or PIU value, and thereby correct the performance of the MRI.

4. The method of claim 1, wherein the noise signal for determining signal to noise ratios is determined from an area with void signal.

5. The method of claim 1, comprising performing a 3D gradient echo sequence to determine the noise.

6. The method of claim 1, wherein the noise signal for determining signal to noise ratios is determined as the standard deviation of the residual located inside the phantom after subtracting two 3D images resulting from two scans.

7. The method of claim 6, comprising performing two 3D gradient echo sequences to determine the noise.

8. The method of claim 1, wherein the noise signal for determining the signal to noise ratio is determined by repeating the scan in the absence of resonance frequency excitation.

9. The method of claim 1, wherein the plurality of receiver coils comprises phased-array receiver coils.

10. The method of claim 1, wherein the plurality of receiver coils comprises transmission/receiver coils.

11. The method of claim 1, wherein a 3D gradient echo sequence is used to scan the 3D phantom.

12. The method of claim 1, wherein the performance of the MRI is deemed acceptable if reference $SNR_{mv}$ value, reference $SNR_{max}$ value, and/or reference PIU uniformity value is within ±25% of the median or mean $SNR_{mv}$ value, median or mean $SNR_{max}$ value, and/or median or mean PIU uniformity value, respectively, determined from the n+1 3D images.

13. The method of claim 1, wherein the phantom is a uniform sphere.

14. The method of claim 1, wherein the phantom is a phantom torso.

15. A non-transitory computer readable medium comprising instructions encoded thereon for performing the method of claim 1.

16. A computer system comprising a program for determining the performance of one or more receiver coils of an MRI machine, or of a hybrid-MRI machine, the computer system comprising a processor and a memory encoding one or more programs coupled to the processor, wherein the processor effects the one or more programs to perform a method of determining the performance of one or more receiver coils of a magnetic resonance imaging (MRI) machine or a hybrid-MRI machine comprising a plurality of radiofrequency receiver coils, the method comprising:
   scanning a 3D phantom, which phantom is uniform, in the MRI machine or in the hybrid-MRI machine;
   obtaining an individual 3D image of the phantom for each individual receiver coil of the plurality of receiver coils, and also constructing a composite 3D image of the phantom from the composite of the signals received by the plurality of receiver coils, so as to produce n+1 3D images, where n= the number of coils in the plurality of receiver coils;
   determining a measurement volume from the composite 3D image;
   obtaining a 3D region of interest measurement volume ($ROI_{mv}$) from the measurement volume of the composite 3D image;
   determining, for each of the n+1 3D images, (i) the maximum mean signal intensity within the 3D image measurement volume ($ROI_{max}$), and (ii) the minimum mean signal intensity within the 3D image measurement volume ($ROI_{max}$), and determining (iii) a location of a signal void region from where standard deviation can be measured ($ROI_{noise}$) from the composite 3D image;
   determining, for each of the n+1 3D images, the signal to noise ratio of the measurement volume ($SNR_{mv}$) and/or the maximum signal to noise ratio ($SNR_{max}$) signal to noise ratio for each 3D image and/or the percent image uniformity (PIU) of each 3D image and determining the $ROI_{noise}$; and
   comparing the $SNR_{mv}$ and/or $SNR_{max}$ and/or the PIU of each 3D image to a reference $SNR_{mv}$ value, reference $SNR_{max}$ value, and reference PIU value, respectively, so as to determine the performance of the one or more receiver coils,
wherein a $SNR_{mv}$ and/or $SNR_{max}$ and/or the PIU less than the reference value of $SNR_{mv}$, $SNR_{max}$ and/or PIU, respectively, is considered unacceptable performance.

17. The computer system of claim 16, comprising a visual display.

18. The computer system of claim 17, wherein the visual display displays the determined $SNR_{max}$ of each receiver coil in a color-coded manner.

19. An apparatus comprising the computer system of claim 16, and instructions for use.

20. The apparatus of claim 19, further comprising an MRI device or a hybrid-MRI device.

* * * * *